(12) United States Patent
Chen

(10) Patent No.: US 6,400,016 B2
(45) Date of Patent: Jun. 4, 2002

(54) METHOD FOR MOUNTING A SEMICONDUCTOR CHIP ON A SUBSTRATE AND SEMICONDUCTOR DEVICE ADAPTED FOR MOUNTING ON A SUBSTRATE

(76) Inventor: I-Ming Chen, No. 60, Lane 328, Li-Shan St., Nei-Hu Dist., Taipei (TW)

( * ) Notice: Subject to any disclaimer, the term of this patent is extended or adjusted under 35 U.S.C. 154(b) by 0 days.

(21) Appl. No.: 09/725,431

(22) Filed: Nov. 29, 2000

Related U.S. Application Data

(63) Continuation-in-part of application No. 09/688,855, filed on Oct. 16, 2000, and a continuation-in-part of application No. 09/564,989, filed on May 5, 2000.

(30) Foreign Application Priority Data

Sep. 29, 2000 (TW) .................................. 089100578A02

(51) Int. Cl.[7] .................... H01L 23/48; H01L 23/52; H01L 29/40
(52) U.S. Cl. ........................................ 257/734; 257/777
(58) Field of Search .................. 257/666, 673, 257/668, 678, 690, 707, 734, 735, 737, 738, 777, 778, 779, 781

(56) References Cited

U.S. PATENT DOCUMENTS

| | | | | |
|---|---|---|---|---|
| 5,990,546 A | * | 11/1999 | Igarashi et al. | 257/700 |
| 6,143,991 A | * | 11/2000 | Moriyama | 174/261 |
| 6,200,143 B1 | * | 3/2001 | Haba et al. | 439/70 |
| 6,205,660 B1 | * | 3/2001 | Fjelstad et al. | 29/885 |

\* cited by examiner

*Primary Examiner*—David Nelms
*Assistant Examiner*—David Nhu
(74) *Attorney, Agent, or Firm*—Christensen O'Connor; Johnson Kindness PLLC

(57) ABSTRACT

A method for manufacturing a semiconductor device includes the steps of providing a semiconductor chip having a pad-mounting surface with a bonding pad, forming an inner bump on the bonding pad, and forming a conductive body on the pad-mounting surface. The conductive body has an anchor portion connecting electrically with and encapsulating the inner bump, and a contact portion offset from the anchor portion and adapted to be connected to a substrate.

8 Claims, 5 Drawing Sheets

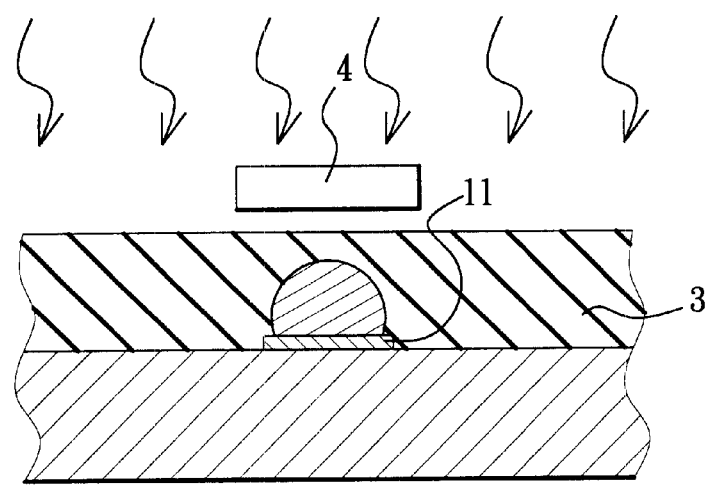
F I G. 3
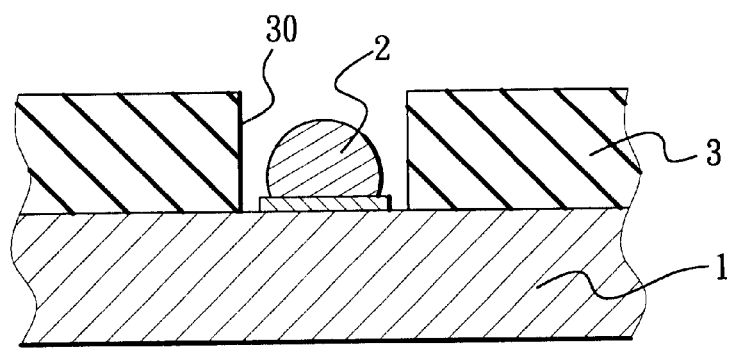
F I G. 4

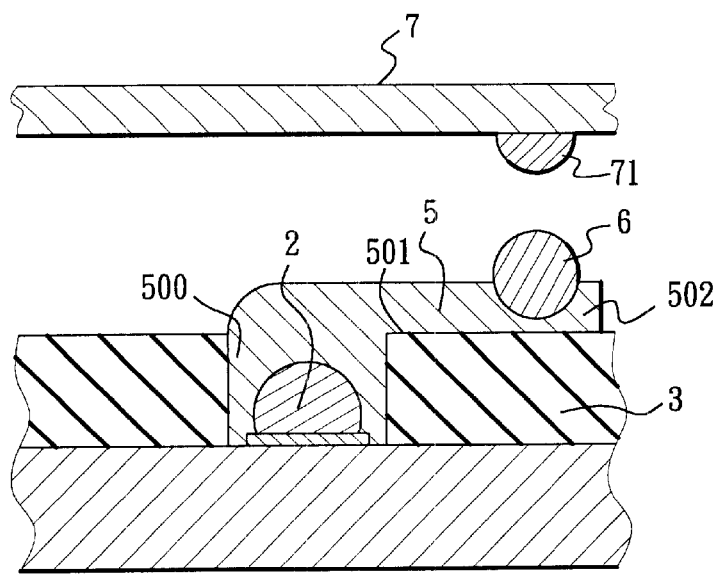
F I G. 5
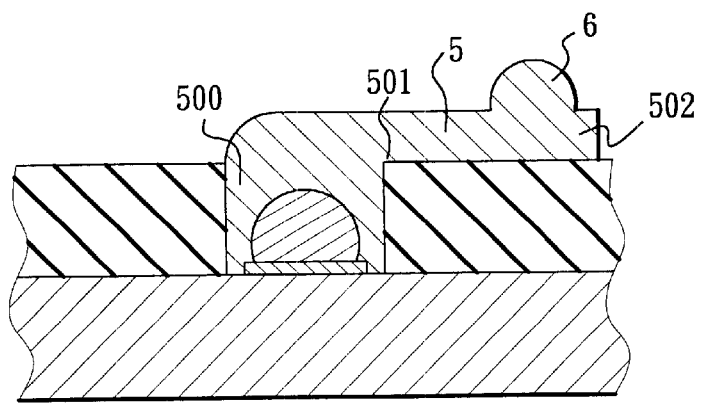
F I G. 6

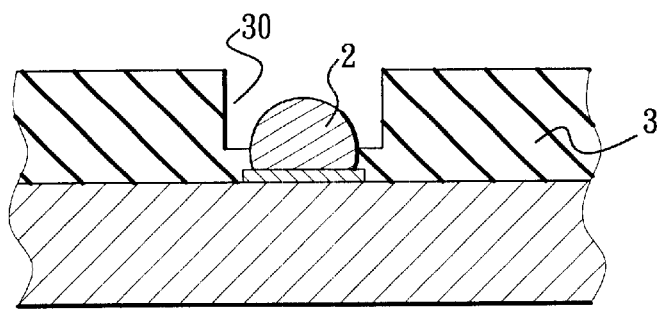
F I G. 7
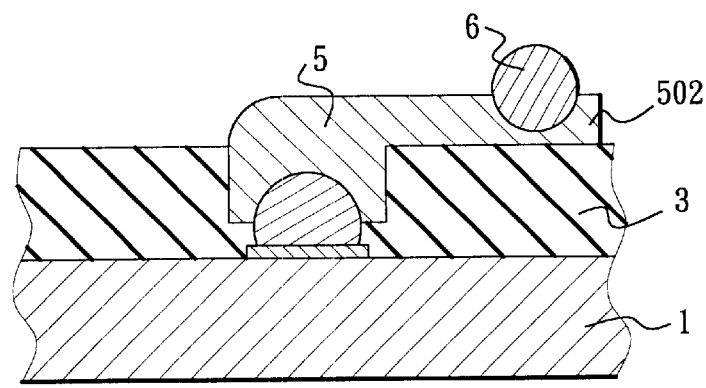
F I G. 8
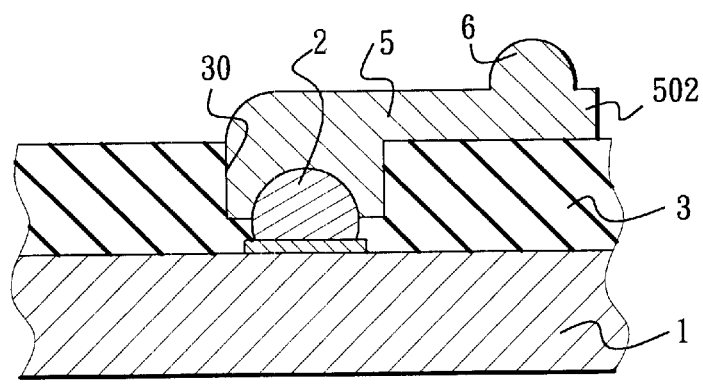
F I G. 9

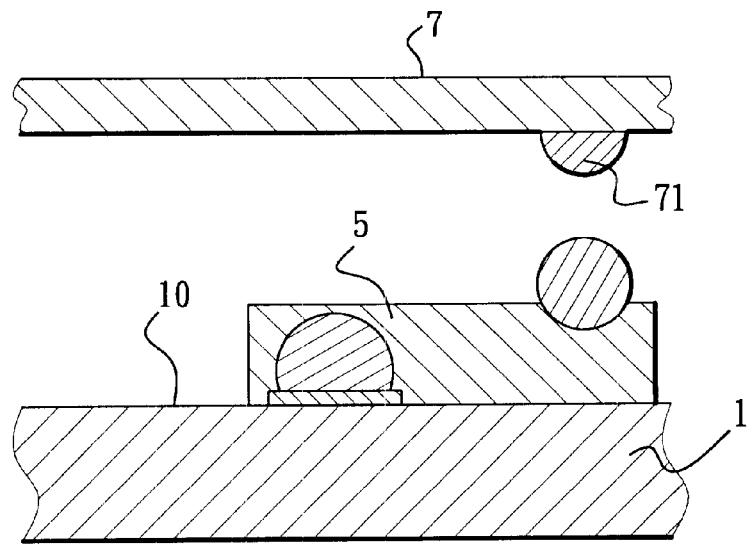
F I G. 10
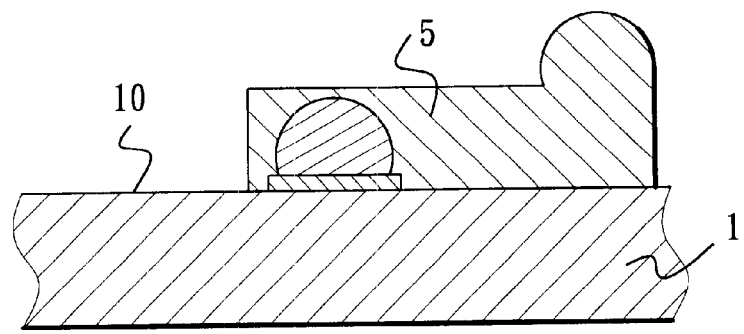
F I G. 11

METHOD FOR MOUNTING A SEMICONDUCTOR CHIP ON A SUBSTRATE AND SEMICONDUCTOR DEVICE ADAPTED FOR MOUNTING ON A SUBSTRATE

This application is a continuation-in-part (CIP) of a co-pending U.S. patent application Ser. No. 09/564,989, filed by the applicant on May 5, 2000, and a co-pending U.S. patent application Ser. No. 09/688,855 filed by the applicant on Oct. 16, 2000, the entire disclosures of which are incorporated herein by reference.

BACKGROUND OF THE INVENTION

1. Field of the Invention

This invention relates to a method for mounting a semiconductor chip on a substrate and to a semiconductor device that is adapted for mounting on a substrate.

2. Description of the Related Art

With the rapid advancement in semiconductor fabrication technology, the bonding pads on the surface of a semiconductor chip are getting smaller in size, and the distance between adjacent bonding pads are getting shorter. These can create difficulty when connecting the semiconductor chip to an external circuit, and can affect adversely the production yield.

In the co-pending U.S. patent application Ser. No. 09/564,989, the applicant disclosed a method for mounting a semiconductor chip on a substrate to prepare a semiconductor device. The substrate has a chip-mounting region provided with a plurality of solder points. The semiconductor chip has a pad-mounting surface provided with a plurality of bonding pads, which are to be connected to corresponding ones of the solder points and which are disposed on the pad-mounting surface at locations that are offset from locations of the corresponding ones of the solder points on the chip-mounting region. The method involves the steps of forming conductive bodies in a conductor-forming mold and transferring the conductive bodies from the mold to the pad-mounting surface of the semiconductor chip via known transfer printing techniques. Each conductive body has an extension portion electrically connected to the respective one of the bonding pads, and a connection portion extending to the location corresponding to that of the respective one of the solder points on the chip-mounting region of the substrate.

In the co-pending U.S. patent application Ser. No. 09/688,855, the applicant disclosed another method for mounting a semiconductor chip on a substrate to prepare a semiconductor device. Similar to the co-pending U.S. patent application Ser. No. 09/564,989, the substrate has a chip-mounting region provided with a plurality of solder points. The semiconductor chip has a pad-mounting surface provided with a plurality of bonding pads, which are to be connected to corresponding ones of the solder points and which are disposed on the pad-mounting surface at locations that are offset from locations of the corresponding ones of the solder points on the chip-mounting region. The method involves the steps of forming a photoresist layer on the pad-mounting surface with a plurality of contact receiving cavities, each of which is registered with and exposes a portion of one of the bonding pads on the pad-mounting surface, and forming a plurality of conductive bodies, each of which is electrically connected to one of the bonding pads, and each of which has an anchor portion filling one of the contact receiving cavities and connected to the respective bonding pad, an extension portion extending from the anchor portion and formed on the surface of the photoresist layer, and a contact portion protruding from one end of the extension portion and formed on the surface of the photoresist layer opposite to the anchor portion. The contact portion is disposed at the position corresponding to a respective one of the solder points on the chip-mounting region of the substrate.

SUMMARY OF THE INVENTION

According to one aspect of the present invention, a semiconductor device is adapted for mounting on a substrate having a chip-mounting region provided with a plurality of solder points. The semiconductor device comprises: a semiconductor chip having a pad-mounting surface provided with a plurality of bonding pads which are disposed on the pad-mounting surface at locations that are offset from locations of corresponding ones of the solder points on the chip-mounting region; a plurality of conductive inner bumps electrically and respectively connected to and protruding from the bonding pads; a photoresist layer formed on the pad-mounting surface of the semiconductor chip, the photoresist layer being formed with a plurality of access holes registered with and exposing at least a portion of a respective one of the inner bumps on the bonding pads; and a plurality of conductive bodies, each of which has an extension portion, an anchor portion, and a contact portion on opposite ends of the extension portion, the anchor portion filling a respective one of the access holes and connecting electrically with and encapsulating at least a portion of a respective one of the inner bumps, the contact portion being formed on an upper surface of the photoresist layer opposite to the pad-mounting surface and being disposed at the location corresponding to a respective one of the solder points on the chip-mounting region of the substrate, the extension portion being formed on the upper surface of the photoresist layer and interconnecting the anchor and contact portions.

BRIEF DESCRIPTION OF THE DRAWINGS

In drawings which illustrate embodiments of the invention,

FIG. 3 is a schematic view to illustrate a mask used in a photolithography process for the photoresist layer of FIG. 2 according to the method of this invention;

FIG. 4 is a schematic view to illustrate an access hole formed in the photoresist layer of FIG. 3 according to the method of this invention;

FIG. 5 is a schematic view to illustrate formation of a conductive body in the access hole of FIG. 4 according to the method of this invention;

FIG. 6 is a schematic view to illustrate formation of another conductive body modified from that of FIG. 5;

FIG. 7 is a schematic view to illustrate a modified access hole formed in the photoresist layer of FIG. 3 according to the method of this invention;

FIG. 8 is a schematic view to illustrate formation of the conductive body in the modified access hole of FIG. 7;

FIG. 9 is a schematic view to illustrate formation of another conductive body modified from that of FIG. 8;

FIG. 10 is a schematic view to illustrate formation of the inner bump and the conductive body on the pad-mounting surface of the semiconductor chip according to a modified method of this invention; and FIG. 11 is a schematic view to illustrate formation of another conductive body modified from that of FIG. 10.

DETAILED DESCRIPTION OF THE PREFERRED EMBODIMENTS

Figure 1:
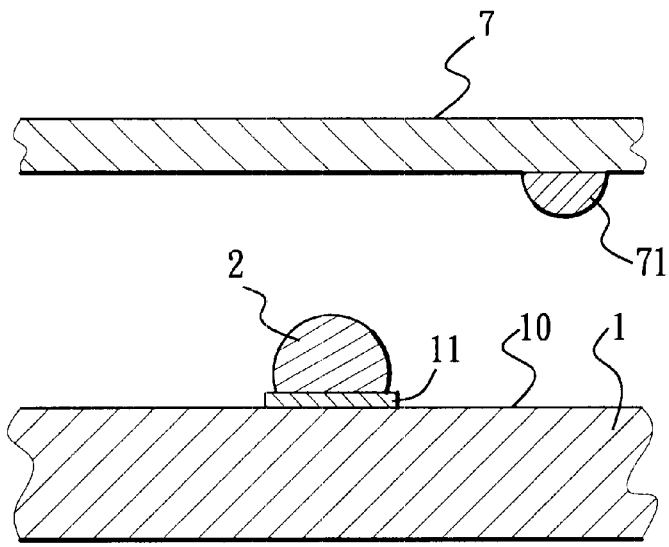
FIG. 1 is a schematic view to illustrate an inner bump formed on a semiconductor chip, which is to be mounted on a substrate according to a method of this invention.

FIG. 1 illustrates a semiconductor chip 1 to be mounted on a substrate 7 according to the method of this invention. The substrate 7 has a chip-mounting region provided with a plurality of solder points 71 (only one solder point 71 is shown). The semiconductor chip 1 has a pad-mounting surface 10 provided with a plurality of bonding pads 11 (only one bonding pad 11 is shown), which are to be connected to corresponding ones of the solder points 71 and which are disposed on the pad-mounting surface 10 at locations that are offset from locations of the corresponding ones of the solder points 71 on the chip-mounting region of the substrate 7.

FIGS. 1 to 5 illustrate consecutive steps of processing the semiconductor chip 1 for forming a semiconductor device that is to be mounted on the substrate 7 according to the method of this invention.

In FIG. 1, a plurality of conductive inner bumps 2 (only one inner bump is shown) are respectively formed on and protrude from the bonding pads 11 on the pad-mounting surface 10 of the semiconductor chip 1 via known soldering techniques.

Figure 2:
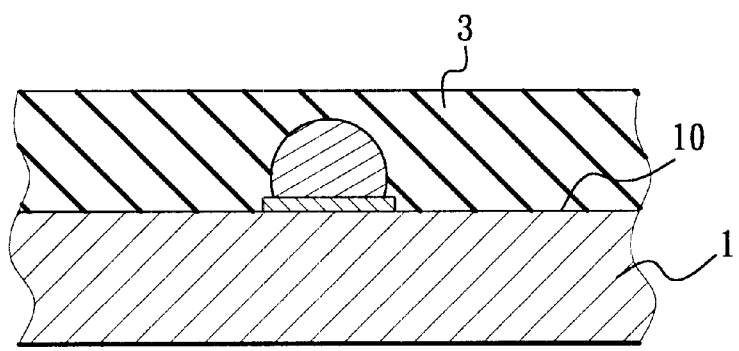
FIG. 2 is a schematic view to illustrate a photoresist layer formed on a pad-mounting surface of the semiconductor chip of FIG. 1 according to the method of this invention.

In FIG. 2, a light-curable layer, such as a photoresist layer 3, is formed on the pad-mounting surface 10 such that the inner bumps 2 are embedded in the photoresist layer 3.

In FIG. 3, a mask 4 is superimposed on the photoresist layer 3, and the photoresist layer 3 is exposed at positions that are offset from the inner bumps 2 and the bonding pads 11. The exposed portion of the photoresist layer 3 hardens, and forms an insulative isolating layer that covers the pad-mounting surface 10.

In FIG. 4, a plurality of access holes 30 (only one is shown) are formed in the photoresist layer 3 by removing the unexposed portion of the photoresist layer 3 from the isolating layer via solvent washing. Each of the access holes 30 exposes a portion of a respective one of the inner bumps 2. Each of the access hole 30 has a depth from an upper surface of the photoresist layer 3 to the pad-mounting surface 10 of the semiconductor chip 1 that is opposite to the upper surface of the photoresist layer 3.

In FIG. 5, a plurality of conductive bodies 5 (only one is shown) are formed respectively in the access holes 30. Each of the conductive bodies 5 has an extension portion 501, and an anchor portion 500 and a contact portion 502 on opposite ends of the extension portion 501. The anchor portion 500 fills a respective one of the access holes 30, and connects electrically with and encapsulates a respective one of the inner bumps 2. The contact portion 502 is formed on the upper surface of the photoresist layer 3, and is disposed at the location corresponding to a respective one of the solder points 71 on the chip-mounting region of the substrate 7. The extension portion 501 is formed on the upper surface of the photoresist layer 3, and interconnects the anchor and contact portions 500, 502. An outer bump 6 is subsequently formed on and protrudes from the contact portion 502 of each conductive body 5 via known soldering techniques after formation of the conductive bodies 5, and is registered with the respective one of the solder points 71 on the chip-mounting region of the substrate 7.

The inner and outer bumps 2 are preferably formed from tin solder, and the conductive bodies 5 are formed from conductive paste that contains a metal selected from a group consisting of gold, silver, copper, iron, tin, and aluminum.

FIG. 6 illustrates a modified conductive body 5 for each bonding pad 11. Instead of forming the outer bump 6 on the contact portion 502 of each conductive body 5 by soldering techniques, the outer bump 6 is formed integrally with the anchor and extension portions 500, 501 of the respective conductive body 5.

FIGS. 7 to 9 illustrate a modified access hole 30 formed in the photoresist layer 3 for each conductive body 5 according to the aforesaid method of this invention. Each access hole 30 extends from the upper surface of the photoresist layer 3 to a level that is above the pad-mounting surface 10 and that is below a top portion of the respective inner bump 2. The conductive bodies 5 shown in FIGS. 8 and 9 correspond to those shown in FIGS. 5 and 6, but with the anchor portions of the same encapsulating only portions of the inner bumps 2. The remaining portions of the inner bumps 2 are embedded in the photoresist layer 3.

FIGS. 10 and 11 illustrate a modified method of this invention based on the previous embodiment. The conductive bodies 5 shown in FIGS. 10 and 11 correspond to those shown in FIGS. 5 and 6, except that no photoresist layer 3 is formed on the pad-mounting surface 10. Formation of the conductive bodies 5 on the pad-mounting surface 10 in the method of FIGS. 10 and 11 can be carried out by known printing techniques as disclosed in the aforesaid co-pending applications.

With the design of the conductive bodies 5 according to the method of this invention, the difficulty encountered in the prior art can be abated, and the production yield can be significantly increased. Moreover, with the anchor portions 500 of the conductive bodies 5 anchoring at the inner bumps 2, the former can be held firmly in contact with the bonding pads 11 without peeling off during the subsequent processing steps, such as thermal test.

With the invention thus explained, it is apparent that various modifications and variations can be made without departing from the spirit of the present invention. It is therefore intended that the invention be limited only as recited in the appended claims.

I claim:

1. A semiconductor device adapted for mounting on a substrate, the substrate having a chip-mounting region provided with a plurality of solder points, said semiconductor device comprising:

a semiconductor chip having a pad-mounting surface provided with a plurality of bonding pads which are disposed on said pad-mounting surface at locations that are offset from locations of corresponding ones of the solder points on the chip-mounting region;

a plurality of conductive inner bumps electrically and respectively connected to and protruding from said bonding pads;

a photoresist layer formed on said pad-mounting surface of said semiconductor chip, said photoresist layer being formed with a plurality of access holes registered with and exposing at least a portion of a respective one of said inner bumps on said bonding pads; and a plurality of conductive bodies, each of which has an extension portion, an anchor portion, and a contact portion on opposite ends of said extension portion, said anchor portion filling a respective one of said access holes and connecting electrically with and encapsulating a respective one of said inner bumps and a respective one of said bonding pads, said contact portion being formed on an upper surface of said photoresist layer opposite to said pad-mounting surface and being disposed at the location corresponding to a respective one of the solder points on the chip-mounting region of the substrate, said extension portion being formed on said upper surface of said photoresist layer and interconnecting said anchor and contact portions.

2. The semiconductor device of claim 1, wherein each of said access holes has a depth from said upper surface of said photoresist layer to said pad-mounting surface of said semiconductor chip.

3. The semiconductor device of claim 1, wherein said contact portion of each of said conductive bodies is formed with a conductive outer bump that protrudes therefrom in a transverse direction relative to said extension portion, and is integrally formed with said anchor and extension portions.

4. The semiconductor device of claim 1, further comprising a conductive outer bump formed on said contact portion of each of the conductive bodies such that said outer bump protrudes from said contact portion in a transverse direction relative to said extension portion.

5. The semiconductor device of claim 1, wherein said inner bumps are made of tin solder, and said conductive bodies are made of a conductive metal paste that contains a metal selected from a group consisting of gold, silver, copper, iron, tin, and aluminum.

6. A semiconductor device adapted for mounting on a substrate, the substrate having a chip-mounting region provided with a plurality of solder points, said semiconductor device comprising:

a semiconductor chip having a pad-mounting surface provided with a plurality of bonding pads which are disposed on said pad-mounting surface at locations that are offset from locations of corresponding ones of the solder points on the chip-mounting region;

a plurality of conductive inner bumps electrically and respectively connected to and protruding from said bonding pads; and a plurality of conductive bodies, each of which has an extension portion, an anchor portion, and a contact portion on opposite ends of said extension portion, said anchor portion connecting electrically with and encapsulating a respective one of said inner bumps, said contact portion being formed on said pad-mounting surface and being disposed at the location corresponding to a respective one of the solder points on the chip-mounting region of the substrate, said extension portion being formed on said pad-mounting surface and interconnecting said anchor and contact portions.

7. The semiconductor device of claim 6, further comprising a conductive outer bump formed on said contact portion of each of said conductive bodies such that said outer bump protrudes from said contact portion in a transverse direction relative to said extension portion.

8. The semiconductor device of claim 6, wherein said inner bumps are made of tin solder, and said conductive bodies are made of a conductive metal paste that contains a metal selected from a group consisting of gold, silver, copper, iron, tin, and aluminum.

* * * * *